US006774827B2

(12) United States Patent
Pau et al.

(10) Patent No.: US 6,774,827 B2
(45) Date of Patent: Aug. 10, 2004

(54) CODE COMPRESSION PROCESS, SYSTEM AND COMPUTER PROGRAM PRODUCT THEREFOR

(75) Inventors: Danilo Pietro Pau, Sesto San Giovanni (IT); Emiliano Mario Angelo Piccinelli, Monza (IT); Roberto Sannino, Romano di Lombardia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/613,536

(22) Filed: Jul. 2, 2003

(65) Prior Publication Data

US 2004/0075598 A1 Apr. 22, 2004

(30) Foreign Application Priority Data

Jul. 3, 2002 (EP) .............................................. 02425440

(51) Int. Cl.[7] .................................................. H03M 7/00

(52) U.S. Cl. ......................... 341/107; 341/51; 382/240

(58) Field of Search ................................ 341/107, 106, 341/50–52, 79; 704/9, 10; 382/244, 240

(56) References Cited

U.S. PATENT DOCUMENTS

| | | | | |
|---|---|---|---|---|
| 5,794,178 A | * | 8/1998 | Caid et al. ...................... | 704/9 |
| 5,815,096 A | * | 9/1998 | Smith ........................... | 341/51 |
| 5,943,421 A | * | 8/1999 | Grabon ......................... | 380/269 |
| 6,100,824 A | * | 8/2000 | MacLeod et al. ............. | 341/51 |

OTHER PUBLICATIONS

Fischer, T., "A Pyramid Vector Quantizer," *IEEE Transactions on Information Theory* IT–32(4):568–583, Jul. 1986.

IBM, "CodePack™ PowerPC Code Compression Utility User's Manual, Version 4.1," Jan. 3, 2001, retrieved from URL:http://www–3.ibm.com/chips/techlib/techlib.nsf/products/Codepack on Jan. 14, 2003.

Lefurgy, C. et al., "Evaluation of a High Performance Code Compression Method," in *Proceedings of The 32nd Annual ACM/IEEE International Symposium on Microarchitecture*, Nov. 16–18, 1999—Haifa, Israel; Nov. 16, 1999—Los Alamitos, CA:IEEE Comp. Soc, US, pp. 93–102.

* cited by examiner

*Primary Examiner*—Brian Young
*Assistant Examiner*—John B Nguyen
(74) *Attorney, Agent, or Firm*—Lisa K. Jorgenson; Robert Iannucci; Seed IP Law Group PLLC

(57) ABSTRACT

Binary words are converted between a non-encoded format and a compressed encoded format, in which the binary words are, at least in part, represented by encoded bit sequences that are shorter than the respective binary word in the non-encoded format. The shortest encoded bit sequences are selected according to the statistical recurrence of the respective words in the non-encoded format, and associated with the binary words with higher recurrence are encoded bit sequences comprising bit numbers that are accordingly smaller. The correspondence between binary words in non-encoded format and the encoded bit sequences associated to them is established by means of indices of an encoding vocabulary. The conversion process includes: arranging the indices in an ordered sequence; organizing the sequence into groups of vectors; splitting each group into a given number of vectors; and encoding the vectors independently from one another.

26 Claims, 9 Drawing Sheets

CODE COMPRESSION PROCESS, SYSTEM AND COMPUTER PROGRAM PRODUCT THEREFOR

BACKGROUND OF THE INVENTION

1. Field of the Invention

The present invention relates to techniques for compression of codes.

The invention has been developed with particular attention paid to its possible application to systems of an embedded type. Reference to the above possible application must not, however, be interpreted as in any way limiting the scope of the invention, which is altogether general.

2. Description of the Related Art

In the implementation of processors and, in particular, processors for embedded systems, it is necessary to take into account various limitations. Amongst these, the main limitations are represented by costs, power absorption and area of silicon occupied.

The limitations in terms of cost are dictated by the desire to use said processors as control devices in digital systems of a consumer type (for instance, for smart-card applications), where high volumes of production must be accompanied by low costs per unit produced.

The aspect of power absorption is becoming increasingly important, also in view of the application of such processors to devices such as cell-phone devices, the so-called "portable digital assistant" (PDA), etc., where it is important to prolong battery life as much as possible.

As regards the area on silicon occupied or, in general, the die size, if applications of the smart-card type are, in particular, considered, it emerges clearly that it is imperative to arrive at small areas of silicon occupation.

On the other hand, current applications require an increasingly high level of flexibility in order to enable all the functional requirements to be met. This fact means that it is necessary to load increasingly substantial portions of software code into the system memories, in order to execute them on the corresponding processor (for example, DSP or CPU). This fact, in turn, results in the tendency to use memories that are costly and are likely to absorb a lot of power.

There, thus, exists the need to provide solutions for reducing the size of the program memory of a device of the type described above.

A solution of this type is the one known by the commercial name IBM CodePackT™. In this connection, it is useful to consult the corresponding user manual entitled IBM CodePack™ Power PC Code Compression Utility, User's manual version 4.1.

The algorithm in question has been developed with the chief aim of improving performance of the Power PC core. The architecture of the core in question, which has been designed as a typical RISC (Reduced Instruction Set Computer) architecture, incorporates instructions of a fixed length to simplify the design of high-performance processors. Almost always, instructions of a fixed length provide a code density that is smaller than that of a CISC (Complete Instruction Set Computer) design, but for the majority of applications of an embedded type, for which cost is a highly significant factor, code density is an important design parameter.

The compression scheme adopted in the IBM solution referred to above is based upon the observation that the Power PC instructions used in real applications are not evenly distributed over all the 32 bits used for representing an individual instruction. Certain instruction configurations or patterns appear with a much higher frequency than others. From the conceptual standpoint, these instructions can be represented by means of special bit sequences, which are shorter than the original instructions, and are replaced with the original instructions by the decompression controller when the instructions are sent to the processor core.

It is possible to devise numerous variants of this basic scheme. An improvement that proves effective in the case of 32-bit PowerPC instructions is that of compressing separately the 16 bits occupying a "high" position and the 16 bits occupying the "low" position of the 32 bits that make up the instruction.

In order to increase code density, the instructions most commonly used must be replaced by shorter bit sequences, which are designed to be expanded subsequently by the decompression controller, so as to re-constitute the original Power PC instructions. In order to maximize instruction density, sequences of a variable length, in terms of number of bits, are used, the sequences being located in the memory in end-to-end conditions. The compression software processes the image of the non-compressed code one instruction at a time, examining the instruction, so as to identify matches in the framework of the contents of the decoding table.

As has already been said, the above known technique is applied separately to the 16 "high"-position bits and to the 16 "low"-position bits in the context of the instruction, and the n most frequent "high" values are generally different from the n most frequent "low" values.

In the framework of the known solution considered herein, it is found, however, that both with reference to the "high" bits and with reference to the "low" bits, if a 16-bit string is encountered such that it does not recur with sufficient frequency for it to receive a specific slot in the table, the string of bits in question must be reproduced in "literal" format on 16 bits. This requires the addition of three bits (usually "111") precisely for identifying the string as a bit string that cannot be compressed.

A situation arises which is somewhat incongruent whereby the application of a mechanism designed to carry out a compression means that, in order to represent the 16 original bits, it is necessary to use as many as 19 bits. The situation is rendered even more incongruent when the conditions of non-compressibility considered previously arise both for the 16 "high" bits and for the 16 "low" bits that make up the instruction. The instruction, which originally comprised 32 bits, ends up, in fact, being represented by 38 bits. Consequently, the "compressed" instruction is, in actual fact, not compressed at all, in so far as it has as many as six bits more than the original instruction.

The format for storing the compressed instruction envisages, in order, the tags, i.e., the fields that identify the type of instruction and the procedure used for compression, respectively, of the "high" bits and of the "low" bits and then the index values, i.e., in practice, the representation in compressed form (also in this case, in order, for the "high" bits and the "low" bits).

If all the compressed instructions are designed to be followed in sequence, this relatively simple coding scheme is satisfactory. The decompression controller is, in fact, simply pointed to the start of the image of the compressed instruction, and then fetches and decompresses the flow of the instruction, as required by the processor.

However, there exist application instruction flows that contain a significant number of branchings.

The above flows require the decompression controller to locate the start of the compressed instructions at any location of the addressing area represented by the image of the compressed instruction and render the operation of this scheme more critical.

In fact, to succeed in locating the start of any instruction, it is necessary to have available a mechanism capable of translating the address of the desired instruction into an address that points towards the start of the corresponding complex compressed instruction.

The scheme used in the known solution to which reference is being made envisages splitting the instructions into groups and providing a mechanism that will enable location of the start of the group that contains the desired instruction.

Next, the group is processed by the decoding mechanism until the desired instruction is reached. This mechanism requires, however, an addressing mechanism implemented by means of an index table, which is usually referred to as address-translation table (ATT).

BRIEF SUMMARY OF THE INVENTION

An embodiment of the present invention provides a solution for compression that is able to overcome the drawbacks outlined previously.

According to an embodiment of the present invention, a process converts binary words from a non-encoded format to a compressed encoded format, in which, in the compressed encoded format, binary words are, at least in part, represented by encoded bit sequences that are shorter than the respective binary word in the non-encoded format. The encoded bit sequences are selected according to a statistical recurrence of the respective words in the non-encoded format. Associated with binary words with higher recurrence are encoded bit sequences including numbers of bits that are accordingly smaller. A correspondence between binary words in non-encoded format and the encoded bit sequences associated therewith is established by indices of at least one encoding vocabulary. The process includes: arranging said indices in an orderly sequence; organizing said sequence of indices in groups of vectors; and splitting each group of vectors into a given number of vectors. In addition, the process includes at least one of the following operations: encoding said vectors independently of one another, and calculating and storing in a table, for each group of vectors, a starting address of a compressed block, or else differences, expressed in bytes, with respect to a last complete address appearing in said table.

Some embodiments of the invention also regard the corresponding system, as well as the corresponding computer program product, which can be loaded directly into the memory of a digital processor and which contains portions of software code that are able to implement the process when the product is executed on a digital processor.

The process provides a compression technique that is able to operate directly on the binary code generated by the compiler for compressing it and generating a new binary file, the size of which is approximately 40% smaller than the size of the original file.

The compressed file can thus be loaded into the program memory of the processor.

The decoder may preferably be made in the form of a small ASIC, which can be located between the system bus and the instruction cache memory (for example, in the memory control unit or MCU or, if a hierarchy of caches with at least two cache levels is present, between the first and the second levels, so as to mask its latency better), or else directly at the output terminal of the external memory.

BRIEF DESCRIPTION OF THE SEVERAL VIEWS OF THE DRAWINGS

The invention will now be described, purely by way of non-limiting example, with reference to the attached drawings, in which.

DETAILED DESCRIPTION OF THE INVENTION

Figure 1:
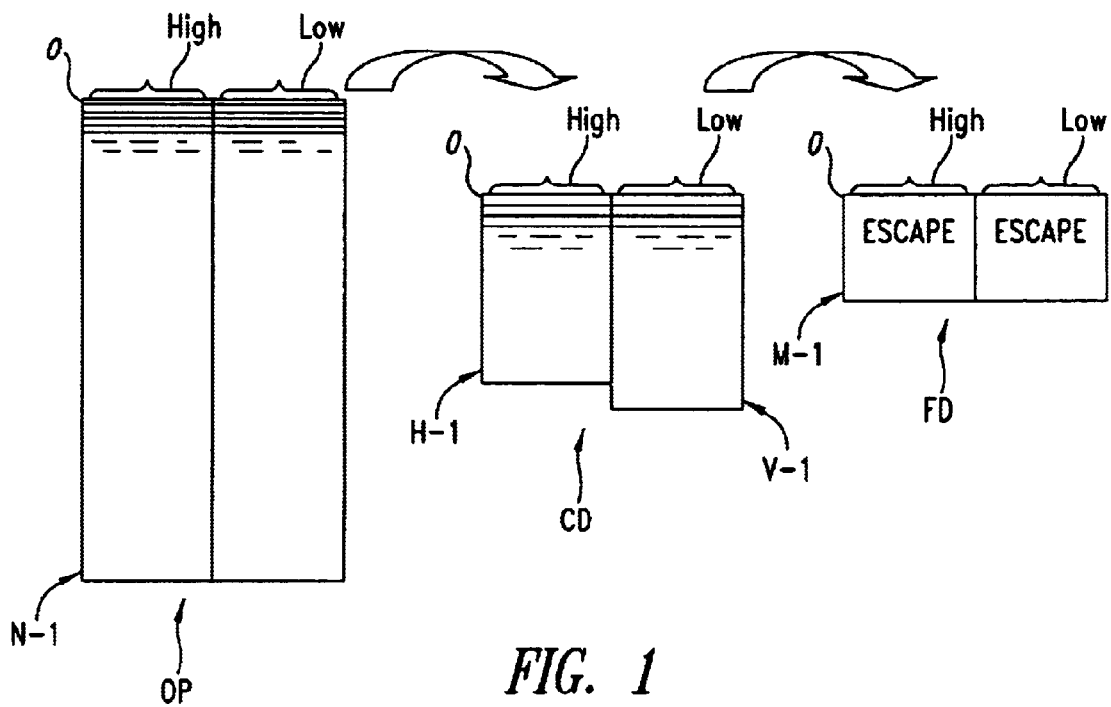
FIGS. 1 and 2 illustrate the construction of the vocabularies and the hierarchy of the data usable in a solution according to the invention.

With reference to the diagram of FIG. 1, consider starting from a non-compressed sequence of N instructions (from 0 to N-1) which form an original program OP designed to be executed by a processor, just as it has been written by the compiler. Each instruction is assumed to be n bits long (where n is a multiple of two).

It is thus possible to consider splitting the input data stream into d different streams of sub-instructions obtained from the original stream, extracting therefrom d different parts. The sum of d homologous sub-instructions (which belong to the same original non-compressed instruction on n bits) is equal to n (with $n_1+n_2+\ldots+n_k+\ldots+n_m=n$), where $n_k$ is the number of bits comprised in the k-th sub-instruction.

In what follows, for reasons of simplicity, we shall consider the case where n is 32 bits, m is 2 and $n_1=n_2$ is 16 bits, so that in the framework of the individual instruction it is possible to distinguish a "high" portion and a "low" portion and that the "high" part and the "low" part each contain the same number of bits, for example, 16 bits in the case where the number n of bits contained in each instruction is 32.

It will be appreciated that the choice of the aforesaid specific values, and in particular the partition of the individual instruction into two identical portions, is not in any way imperative for the purposes of implementation of the invention, given that what is said hereinafter with reference to this specific case (which is cited chiefly for reasons of simplicity of illustration) applies to any partition whatsoever.

On the basis of statistical considerations, it is possible to note that the probability density of the occurrences of each half-instruction describes a Laplacian curve. For this reason, it is possible to calculate two different vocabularies of size M that contain the M-1 most frequent instructions for each half of the original flow of instructions.

Of course, the above M-1 instructions (where M is much smaller than N) are not such as to cover the total set of program instructions. Consequently, it is necessary to reserve one of the M words available in each dictionary or vocabulary as way of escape and to associate to this particular word, referred to as "escape" word, a probability of occurrence equal to the sum of the occurrences of all the words that do not belong to the sets of the vocabulary, and then to re-order all the words, processing the escape word like the others.

It may be noted that a good candidate for M is a power of two (for example, it is possible to take $M=2^{10}=1024$, where M-1=1023 are the real words, and one is the word that functions as escape word).

In the diagram of FIG. 1, the reference CD represents the complete vocabularies which are formed according to the criteria described previously and which comprise H and V words for the "high" portions and the "low" portions, respectively. Finally, the reference FD indicates the final vocabularies, which comprise M words, and which are also divided into a "high" portion and a "low" portion, with the representation of the escape word in both cases.

Once the vocabularies have been identified, as described previously, it is possible to replace each half-instruction of the code with the corresponding index from 0 to M-2, if present, or with the escape code followed by the original half-word. Of course, the width of the index, expressed in bits and designated by b, must satisfy the following equation:

$$b=\log_2(M)$$

In the example referred to previously, with M equal to 1024, b is equal to 10 bits.

Figure 2:
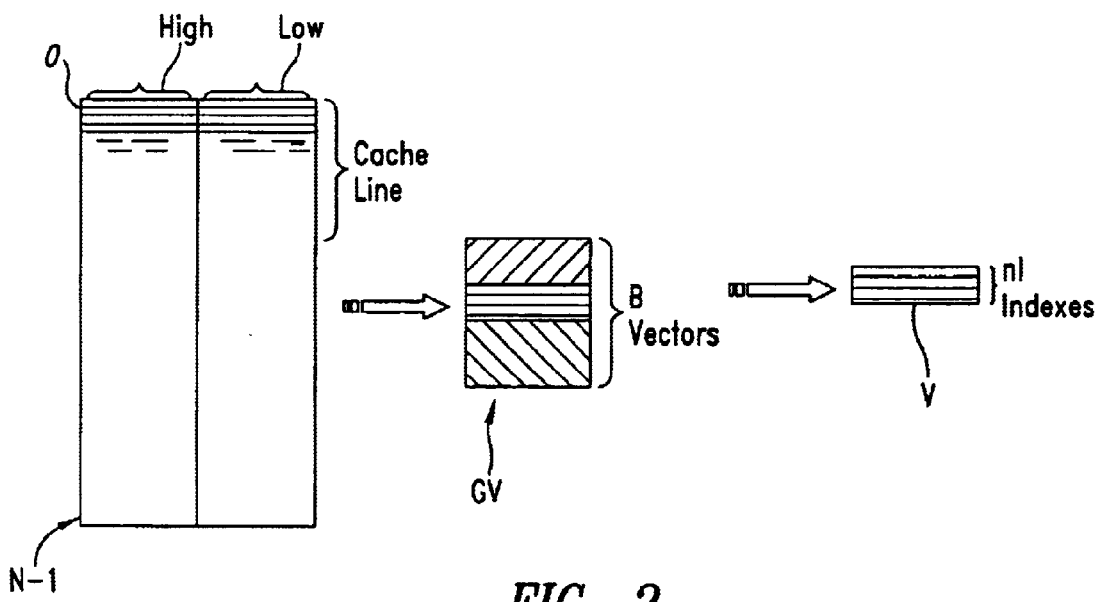

At this point, as is illustrated in FIG. 2, the sequence of indices is grouped together in a group of vectors GV having dimensions (expressed in terms of instructions per vector) equal to the size of the cache row of the processor.

Each group of vectors GV is, in turn, divided into B vectors, which represent the lowest level of the hierarchy and each of which contains a number of indices equal to nl, where nl is given by the ratio $CACHE_{13}$ LINE/B between the length of the cache line of the processor and B, where B and nl are powers of two. Each vector is encoded independently of the others.

Alternativley, for each group of vectors, at the end of the encoding process, the address on 32 bits for start of the compressed block is calculated and saved in a table called address-translation table (ATT), or else the differences, expressed in bytes, with respect to the last complete address appearing in said table are calculated and stored. The above table is then loaded into the internal memory of the decoder. This table enables efficient management of the jumps present in the code, thus enabling a rapid conversion of the addresses.

In order to encode each vector, it is necessary in one embodiment to know the norm of the indices contained therein. By norm is meant the quantity defined as $$norm = \sum_{nl}(index).$$

The size of the norm, in bits, depends upon the size of the vocabularies and, in particular, is equal to nl+b bits.

To continue with the example mentioned previously, where b is 10 bits (M-1=1023), choosing the size of the vector equal to four indices, the maximum size, expressed in bits, of the norm is 12 bits ($2^{12}=4096>1023*4=4092$).

Since this component of the encoded vector may be very important, a way to reduce the amount of bits necessary may be to use a variable-length coding (VLC) just for the norm. The look-up tables of the VLC, which are different for the high part and the low part of the code, can be determined by means of various simulations on different samples (benchmarks) and by noting the recurrence of each possible norm as the parameters given by the size of the vocabulary and by B vary.

Starting from the above data, it is possible to determine the distribution curve for each combination of the two parameters. These curves can be divided into nP parts with equal probability (i.e., with the same area), with numbers of elements within each area rounded off to the nearest multiple of two.

Figure 3:
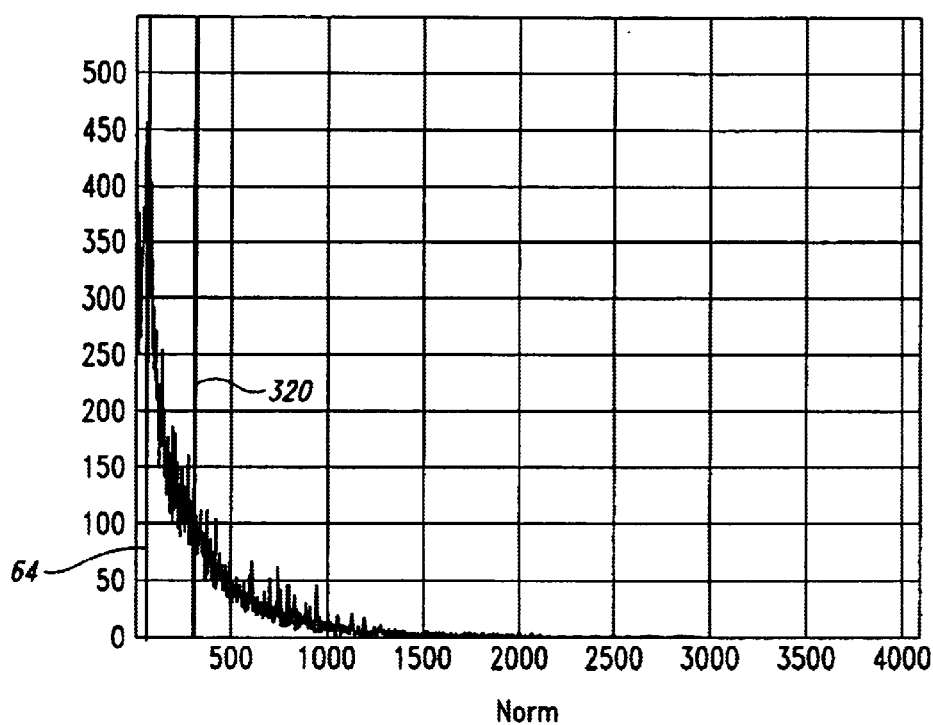
FIGS. 3 to 7 comprise various diagrams that are useful for understanding the mechanism underlying a solution according to the invention.

By way of example, FIG. 3 shows a case for M-1=1023 and nl=4. The curve represents the statistical distribution of the norm for the high part of the code on a wide set of test samples. The two vertical lines express the division of the curve into three parts with equal probability at norm values of 64 for one and 320 for the other.

In this example, the norm values comprised between 0 and 64 are encoded with a first tag bit (for instance, 0) and six bits which represent a real value. The subsequent 256 values are represented by two tag bits (for example 10) and eight bits for the value, and finally, the other 3072 values (which are possible but far from probable) are represented by two tag bits (for example, 11) and twelve bits for the values.

Resorting to the Laplacian statistical distribution of the indices of the vocabularies, it is possible to define as L the number of successive indices coded together as a single encoded word (in all cases, a power of two, comprised between 1 and 32) and a look-up table, referred to in what follows also as $N_{13}$ table, with dimensions [L, K], where L represents the number of words that will be concatenated and K is the maximum possible norm (sum of the absolute values) for the encoded words, which is designed to be pre-calculated, as will be described in greater detail in what follows, without, however, there being any dependence upon the input data.

The encoded word obtained starting from the L successive indices on 16 bits, here referred to as "encoded," is calculated in the following way:

$$encoded = \sum_{i=1}^{L}\sum_{j=1}^{K} Ntable[i, j]$$

where the first summation extends for i ranging from 1 to L and the second summation extends for j ranging from 1 to $x_i$.

Consequently, the number of additions necessary for encoding L indices is equal to $L*\max(x_j)$.

If we return to the example illustrated previously, and if we assume L=4, the maximum number of additions necessary for obtaining an encoded word is 4*1023=4092.

Furthermore, for a given norm value, it is possible to predetermine the number of bits necessary for the encoded word by counting the number of bits necessary, using the following equation:

bit=count(Ntable[L+1.norm])

where "count" is a function that counts the number of bits required by its input parameter. This function can be implemented, for example, with the following pseudo-code:

```
ui32_t count(ui32_t input_number)
{
    ui32_t bits;
    for(bits = 1;; bits+++)
    {
        if((input >> =1) == 0)
    }
    return bits;
}
```

When one or more escape codes have been encoded in a single code word, the original non-compressed word on 16 bits is located in the output stream after said code word.

Figure 4:
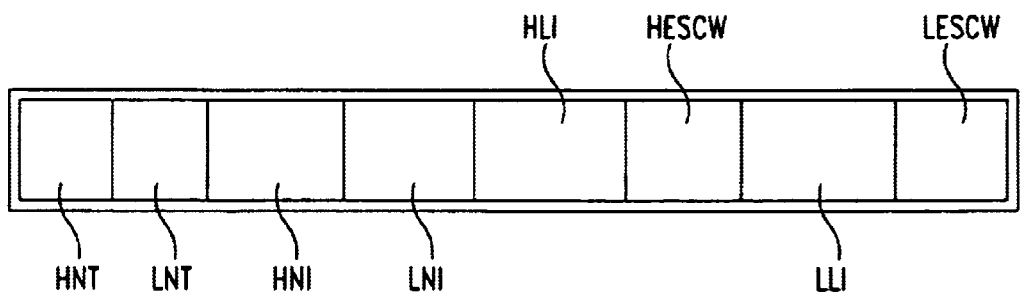

Consequently, the format of the compressed instruction is the one illustrated in FIG. 4, where there appear in order:

the "high" norm tag (HNT);
the "low" norm tag (LNT);
the "high" norm index (HNI);
the "low" norm index (LNI);
the "high" L indices (HLI);
the "high" escape words (HESCW);
the "low" L indices (LLI); and
the "low" escape words (LESCW).

If we return to the table $N_{13}$ table considered previously, it has already been noted that the table has a matrix of size [L, K], where L is the number of words concatenated in a code word and K is the maximum value available for the norm, which depends both on the size of the vocabularies and on the concatenated word.

With reference once again to an example, if L=4 and the vocabularies are made up of 1023 words, the size of the $N_{13}$ table is [1023*4].

In this context of Laplacian statistical distribution, it is useful to refer to the concept of pyramid vector quantizer introduced by Thomas Fischer in the article "A Pyramid Vector Quantizer" appearing in "IEEE Transactions on Information Theory," vol. IT-32, Jul. 4, 1986.

In the article in question, a procedure is described and illustrated for exploiting the properties of a sequence of independent variables having a Laplacian distribution.

Defining $X=\{x_1, x_2, \ldots, x_L\}$ as a vector of random variables $x_i$ (the vocabulary indices, in this case) the probability density of which is $$f_x(a) = \frac{\lambda}{2} e^{-\lambda y}$$

with a zero mean value and variance $$\sigma^2 = 2/\lambda^2,$$

the probability density of the $x_i$ is globally $$f_x(a) = \prod_{i=1}^{L} f_x(a_i) = \left(\frac{\lambda}{2}\right)^L e^{-\lambda y}$$

where the product extends for i ranging from 1 to L and r represents the norm of the vector X $$r = \sum_{i=1}^{L} |x_i| = \|X\|_1.$$

The parameter r specifies a boundary with constant probability density. For a Laplacian source, the mean is $$E[r] = \frac{L}{\lambda}$$

so that it is possible to define a pyramid as follows $$S(L, Q) = \left\{ \forall X \in \mathcal{R}^L : \sum_{i=1}^{L} |x_i| = \|X\|_1 = Q \right\}.$$

The random variable r can be considered as the parameter that represents the surface of a particular pyramid S(L, r).

Figure 5:
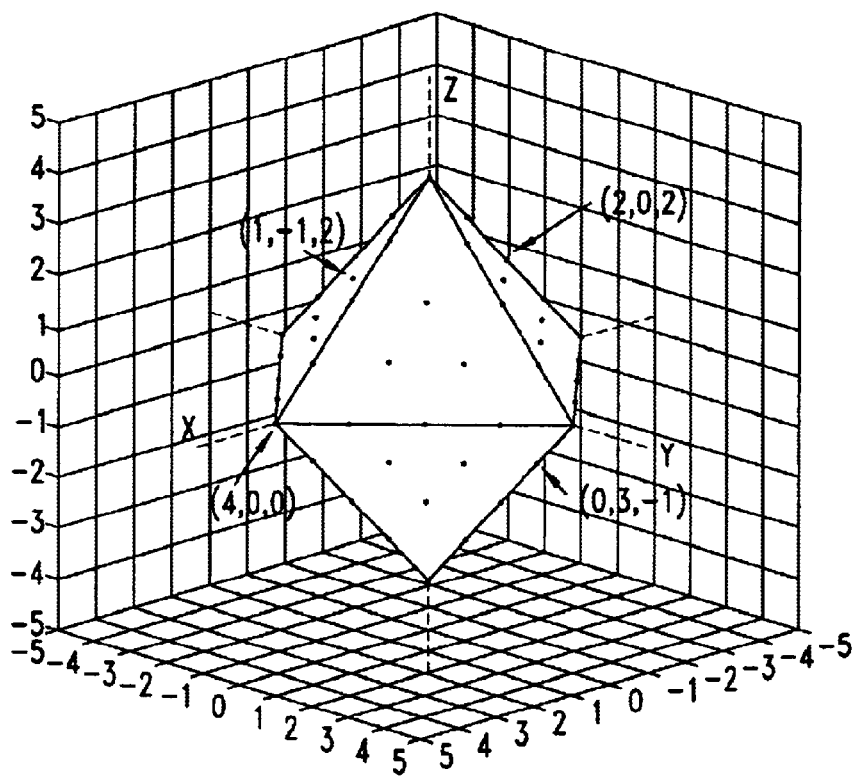

If, then, we define $N_{13}$ table(L, K) as the number of integer points belonging to the surface S(L, K), we see that, for example, in the situation represented in FIG. 5, the integer points on the surface of the pyramid S(3, 4) are illustrated with reference to a pyramid with L=3 dimensions and norm K=4. Belonging to this pyramid are only the integer points the sum of co-ordinates of which (in absolute value) is 4.

Figure 6:
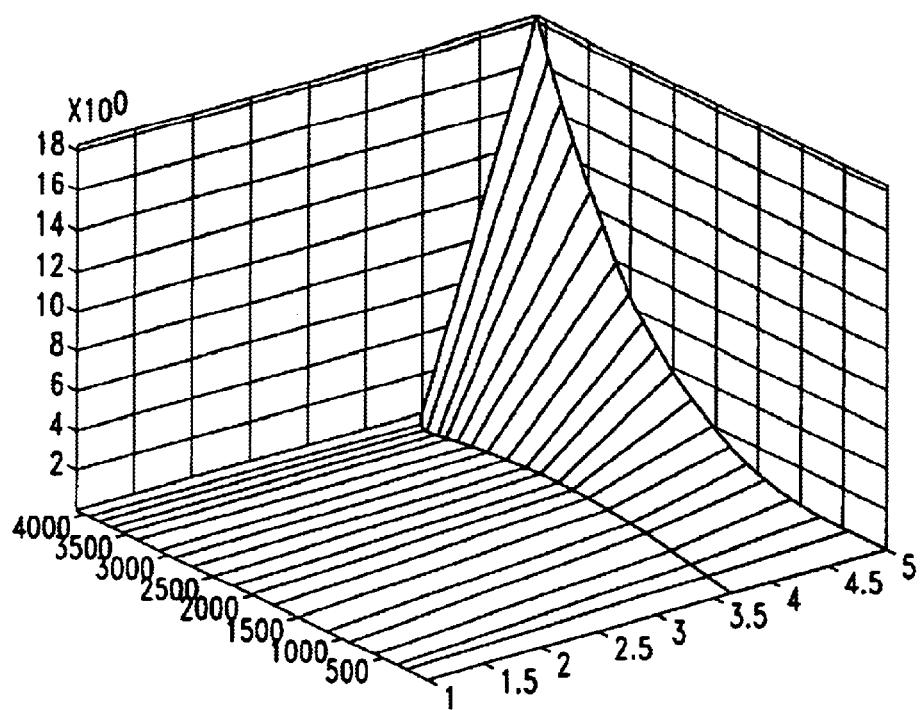

The construction of the table must satisfy the equation $$N(i, j) = \sum_{i=1}^{L} \sum_{j=1}^{K} N(i-1, j) + N(i, j-1)$$

where the first summation extends for i ranging from 1 to L, and the second summation extends for j ranging from 1 to K. For L=4 and a vocabulary size of 1023, we obtain the surface represented in FIG. 6.

In this situation, each value $x_i$ (i.e., the vocabulary index in the concatenated word to be encoded) is allowed to be comprised between 0 and L times the size of the vocabulary. This is not, however, a realistic datum, so that it is more correct to envisage that each $x_i$ will be able to vary between 0 and the size of the vocabulary (hereinafter defined as D).

The equation seen previously is, consequently, modified as shown below $$N(i, j) = \sum_{i=1}^{L} \sum_{j=1}^{K} \sum_{q=0}^{\max(D,j)} N(i, j) + N(i-1, j-q)$$

where the three summations extend, in order, for i ranging from 1 to L, j ranging from 1 to K, and q ranging from 0 to max(D, j).

Figure 7:
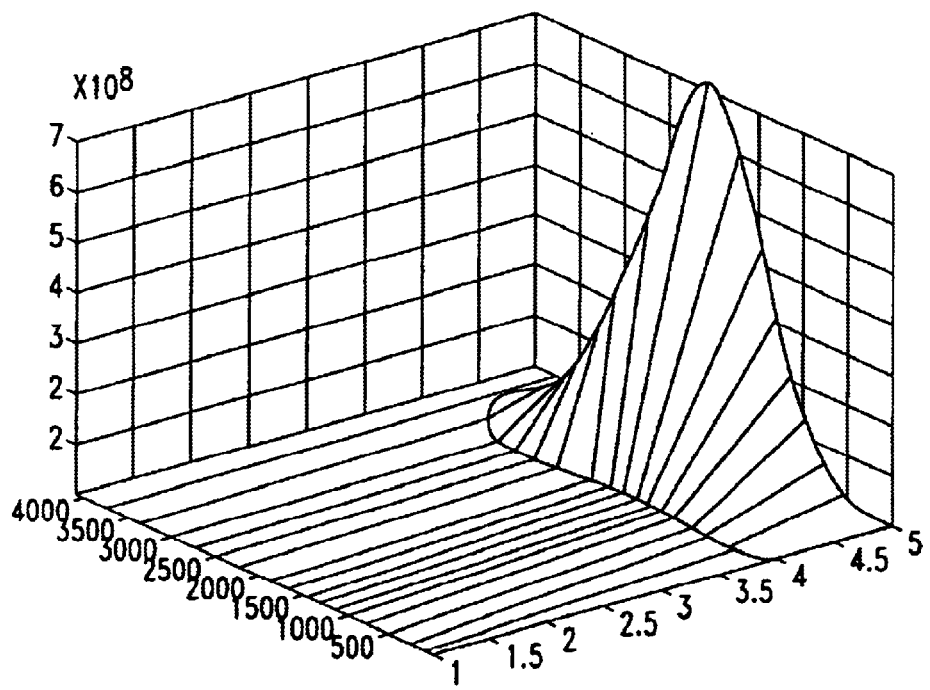

In the above case, for L=4 and a vocabulary size of 1023, we obtain the reduced-norm table surface represented in FIG. 7.

Of course, any type of solution used for compressing the program memory of any type of processor or DSP must be of a lossless type. It must, therefore, be possible to recover all the original instructions, without any loss of information; otherwise, the corresponding program cannot operate correctly.

The above rather severe limitation, which may be slackened in the case of data compression, implies that, in principle, the solution can generate more bits than the ones necessary in the "non-compressed" word.

Of course, this is not acceptable in general terms, above all if the way in which the processor fetches the instructions from the memory is taken into account. Normally, in the fetch function, the processor fetches an entire instruction cache row in a single go, for example, a cache row that is sixteen 32-bit instructions long, which means 64 bytes.

The case can, of course, be extended to any cache line size.

The solution implemented takes into account this fact, seeking to compress a group of instruction vectors in a pre-analysis step and verifying how many bits are necessary. If the bits generated are more than those in the non-compressed condition, it is envisaged that simply the 16 instructions be copied just as they are. Only if the case is otherwise is the compression procedure applied.

For a better understanding of what is said in what follows, it may be useful first to refer to the decompression step, taking into account that one of the main characteristics required for code decompression is that of being able to access any instruction of the code which follows the flow of instructions required by the program that is being executed. This flow is, in general, different from the static sequence of the instructions generated by the compiler, on account of the presence of jumps, loops, and calls for functions.

The adoption of the address-translation table (ATT) referred to previously enables mapping of the address of a non-compressed instruction in the compressed code, so as to be able to decompress any instruction of the program without having necessarily to decompress all the previous instructions.

Essentially, the solution is based upon a hierarchy of the final data which can be summarized in the following terms:

| Compression group | { | 2 consecutive macroblocks (compressed) |
|---|---|---|
| Group of vectors | { | 2 consecutive blocks R = size of cache row/L (compressed) |
| Vector | { | L consecutive instruction on 16 bits with L equal to the integer divider of the size of the cache row (compressed) |
| Instruction | { | single instruction on 16 bits (not compressed) |

On the basis of the mechanism described previously, there has thus been created a particular structure of the compressed stream, where, basically, the aim has been to reduce the size of the norm of the encoded word that represents the n instructions forming a compressed vector.

Figure 8:
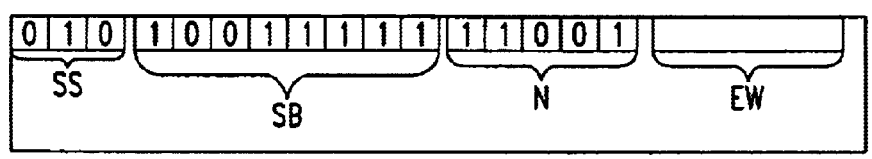
FIGS. 8 and 9 illustrate various diagrams showing the organization of data flow in a solution according to the invention.
Figure 9:
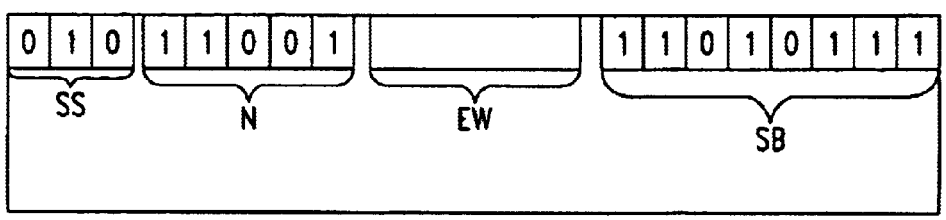

Passing on to a detailed description of the flow organization, with specific reference to FIGS. 8 and 9, it is possible, again by way of example, to assume operation in a condition in which:

the "depth" of the vocabularies is equal to 2 vocabularies, each having a depth of 16 bits;

the maximum size of the vocabulary is 1023 words, including the escape code; and the number of concatenated words that form a vector is 4.

In the above conditions, the maximum theoretical norm that it is possible to obtain for an encoded word (a half-vector, as has been pointed out previously) is 1023*4=4092. The purpose is to reduce it to a value lower than 31.

Instead of encoding the norm using a VLC, as hypothesized previously, this objective can be achieved by sending on, in the bit stream, the least significant bit of each word making up the encoding word and then carrying out a division by a factor 2 (which is equivalent to a right shift of the bits), then continuing recursively until the norm is less than 32 (in this case the norm can always be encoded on 5 bits).

For example, suppose we have a word to be encoded with indices (15, 34, 18, 43, with norm W=15+34+18+43=110, it is possible to proceed as follows:

{15, 34, 18, 43};W=110

{7, 17, 9, 21};forw={1, 0, 0, 1}; W=(110−2)/2=54

{3, 8, 4, 10}; forw={1, 1, 1,1}; W=(54−4)/2=25 so as to achieve the result with two right shifts (S).

In the above formula, forw designates the sets of bits which represent the remainders to be added in the decoding step and which are to be entered in the compressed stream for forwarding.

It may be noted that, in the worst case ({1023, 1023, 1023, 1023}; W=4092), the overall number of shifts is 7, with a residual norm of 28, and the word to be encoded is (7, 7, 7, 7), so that the number of shifts to be executed can again be encoded on 3 bits. FIG. 8 represents the bit stream for a half-vector. Just as it is represented, it thus comprises:

3 bits indicating the shifts carried out (SS);

the number of bits shifted (SB) equal, in the example illustrated, to 4 bits for 2 overall shifts;

the norm (N), represented on 5 bits; and the encoded word (EW).

On the other hand, the one illustrated in FIG. 8 may not be the best way for gathering the numbers into the compressed stream, if the function of the decoder is considered.

Instead of envisaging, for example, S fields of 4 bits, which indicate the remainders shift after shift, it is possible to set the total of 4 remainders, of S bits each, directly, considering the fact that the division is always by 2.

Thus, with reference to the example seen previously, it is possible to set {1, 0, 0, 1}*2+{1, 1, 1, 1}={3, 1, 1, 3}.

Moreover, the S*4 bits corresponding to the remainders of the divisions can be advantageously placed at the end of the stream. This enables the decoder to perform a better reading of the remainders on S*4 bits and to perform the process of decoding the encoded word.

According to this alternative solution, which corresponds to an optimal organization of the stream, as is illustrated in FIG. 9, there is envisaged, in order, the location of the bit strings, corresponding, respectively, to the quantities SS, N, EW, and SB seen previously.

The above composition of the stream, which does not affect the compression factor, considerably simplifies the decompression process.

At best, only 8 bits are, in fact, used for each half-vector, the latter being held to be made up of 8 bytes for each group of vectors (16 instructions). Instead, in the worst case (which is, however, very rare) (3+7*4+5+13)*2*4=140 bits, i.e., 17.5 bytes, are used.

If necessary, the escape words on 16 bits are added. In this case, 16*16*2 bits, i.e., 64 bytes, are added, to make up a total of 64+17.5 =81.5 bytes.

However, this case may be avoided by pre-analysis, so that only the original 64 bytes are encoded.

Note again that it is not necessary for the escape code to be associated with the largest index in the vocabulary. In general, this may be true for the high part of 16 bits in the non-compressed instructions, since this part contains the operand and the operating code, and their variability is not very large.

Instead, with the 16-bit lower part of the instruction the situation can be very different (a fact that is demonstrated in practice), since there are the operands of the instructions and hence their variability proves larger, so that the associated index may be lower (as a function of recurrence).

Figure 10:
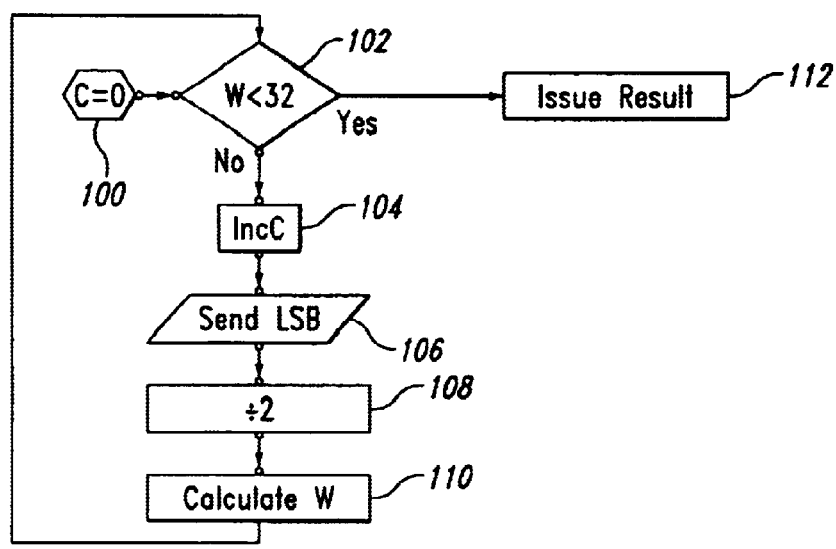
FIG. 10 is a first representation of the process of compression of the data in a solution according to the invention.

The flowchart of FIG. 10 reproduces, in altogether general terms, a compression scheme obtained according to an embodiment of the invention.

Starting from an initial step, designated with 100; in which the count function mentioned previously is set at 0, in a comparison step 102 a check is made to see whether the parameter W, already introduced previously, is less than a predetermined value, such as 32.

If it is not (which is what normally occurs at the beginning of the application), in a sequence of steps designated by 104, 106, 108, and 110 the operations described previously are carried out, i.e., after a prior increment of the count function (step 104), the least significant bit of each word is introduced into the stream (step 106), then the division by 2 is performed (step 108), the norm is calculated (step 110), and the procedure is iterated until the norm is less than the value 32 used in the comparison step designated by 102. Once the iterative process described previously is through, the step 102 yields a positive outcome, and the result is issued in a step designated by 112.

Having made the above general considerations regarding the process of compression, once again it may be useful, in order to proceed in greater detail, to deal first with the aspect of the decompression process.

The above will be done referring to three different possible implementations of the core of the decoder, which differ from one another as regards performance, in terns of speed, and as regards requirements, in terms of computational burden/memory.

In general, a decompressor operating according to an embodiment of the present invention fetches from the external memory the exact group of compressed vectors, taking into account the requirements of the processor.

Assume, in particular, that the program counter (PC) of the processor requires a row of instructions which is not already present in the respective instruction cache (I$).

By dividing this value by the size of the cache row (16, in the examples given previously), the decompressor identifies which is the group of vectors containing the required instruction. Dividing the result again by 2, it obtains also the compression group with the corresponding address of the ATT. If the number of the group of vector is even, the decompressor will have to read just one 26-bit item in the ATT. Otherwise, it will also have to add the offset on 6 bits, so as to obtain the address of the compressed group of vectors in the main memory.

At this point, it can fetch the compressed group of vectors and begin with the decompression proper. In the first place, it will have to read the first three bits (bits SS of FIGS. 8 and 9) to understand how many shifts have been made. Starting from this number, it will read the fields of S bits each R1, R2, R3, and R4, i.e., the information designated by SB in FIGS. 8 and 9, which represent the remainder to be added to the decoded word, as well as the 5 additional bits that represent the norm (field N of FIGS. 8 and 9). At this point, it can read the remaining bits detected on the current vector, i.e., the encoded word proper, which can be compressed with one of the three algorithms that will be described in what follows, so obtaining the four small indices.

To obtain the four actual indices again, it will have to shift the four numbers S times to the left (an operation equivalent to a multiplication by $2^s$) and then add the remainders R1, R2, R3, and R4.

Figure 11:
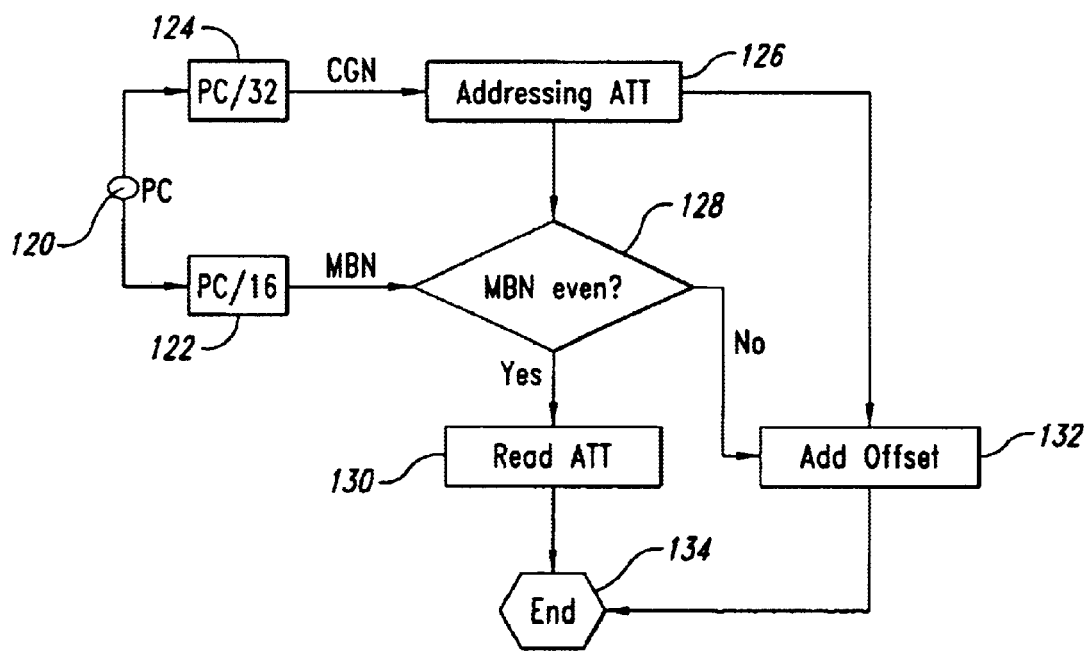
FIGS. 11 to 13 represent, in a complementary way, the decoding process.

FIG. 11 represents with reference to the highest level the process of decompression.

Basically, the decompression process envisages the execution of three orders of steps or operations.

The first order is detection of the address of the starting group of vectors.

With reference to the sequence already described previously, the step 120 designates the request, by the program counter PC, for a row of instructions that is not present in the instruction cache.

It is precisely the steps designated by 122 and 124 that represent the division of the value in question by the size of the cache row (16) and the additional division by 2, respectively. The output from the division step 124 corresponds to the identification of the compression group that enables, in a subsequent step 126, addressing of the ATT.

The step designated by 128 is the step in which a check is made to see whether the number identifying the group of vectors is even.

If the number is even (positive result from step 128), in step 130, the 26-bit item is read in the ATT.

If the result of step 128 is negative (odd number of the group of vectors), the 6 offset bits are added together, an operation which is carried out in step 132.

The reference number 134 designates the step of end of procedure.

Figure 12:
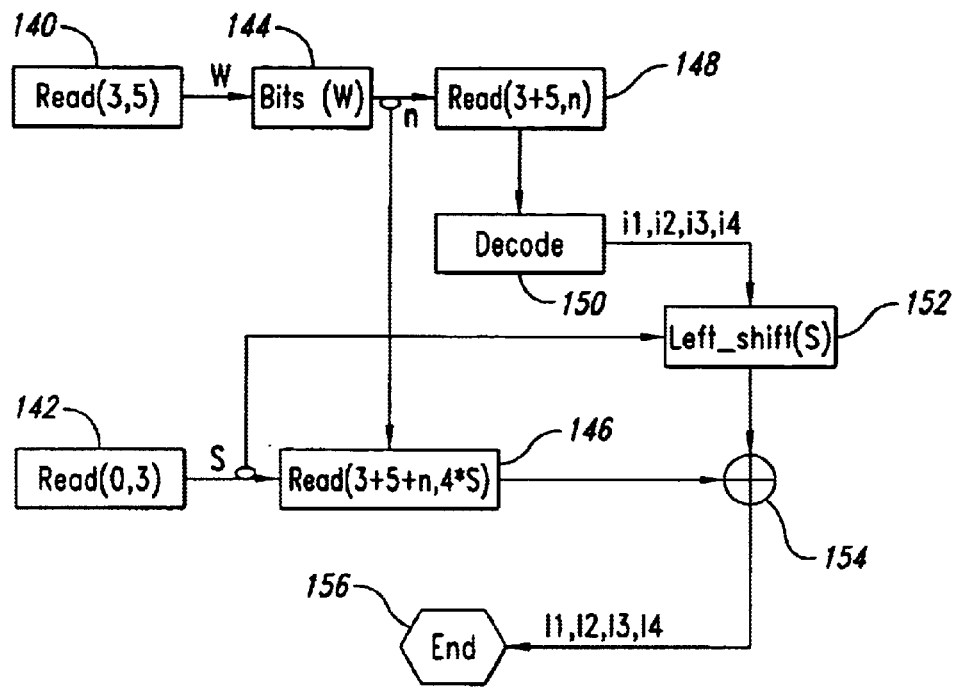

FIG. 12 represents, instead, the second stage of the decoding process, corresponding to the reconstruction of the indices of the starting vocabularies.

Basically, the steps designated by 142 and 144 correspond to the fetching of the group of compressed vectors, to the reading of the information inherent in the number of shifts performed, and to the reading of the information regarding the norm. Starting from this information, in the step designated by 146, four fields R1, R2, R3, and R4 are to be added to the decoded word (read in step 148 and decoded in step 150), so as to generate the indices i1, i2, i3 and i4. The step designated by 152 corresponds to the carrying-out of the shifts according to the information read in step 142, and the node designated by 154 corresponds to the operation of addition which leads to the generation of the indices i1, i2, i3, and i4 before coming to a stop step 156.

Figure 13:
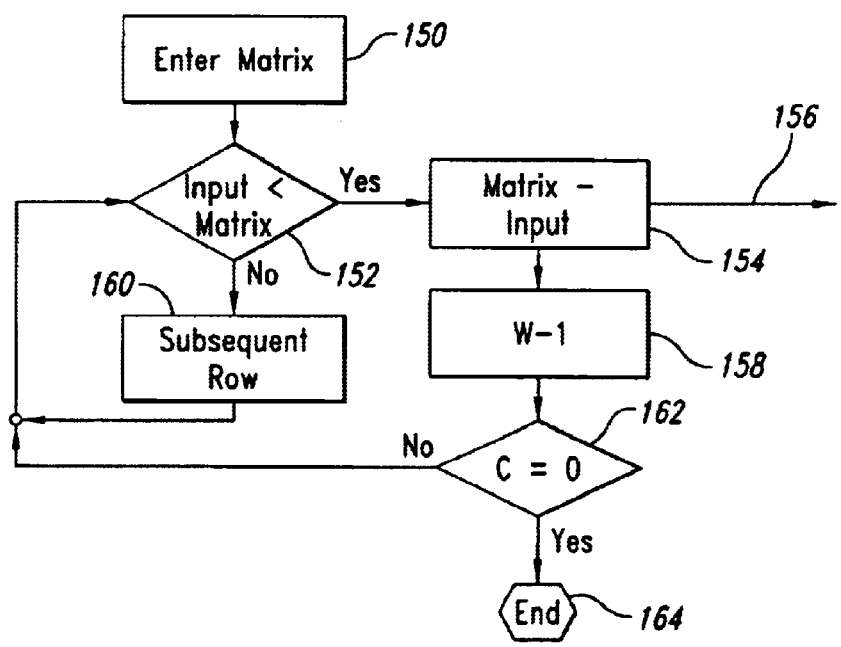

The third stage of the decoding process, represented in FIG. 13, corresponds to the encoding proper.

From a conceptual standpoint, this stage corresponds to the opposite of the compression algorithm described previously with reference to the construction of the table N in the case where the parameters L and K are 4 and 31, respectively, so as to obtain a matrix of dimensions [4, 31].

Starting from the encoded input word, step 150, and from the its norm value, we enter in the last row of the matrix N and in the column indicated by the norm.

The value read in the matrix and the input value are compared in a step designated by 152.

Two cases may arise, as described in what follows.

If the input value is lower than the value read (positive result from step 152), in a step designated by 154, the first value is subtracted from the second value, sending to output the decoded index value, on a line designated by 156. Next, in a step designated by 158, the norm value is reduced by one.

In the event, instead, of step 152 yielding a negative result, the difference between the starting norm and the effective norm is the last of the encoded L indices, so that the process is started, passing, in step 160, from the subsequent row of the column, where the previous comparison yielded a negative result.

The step designated by 162 is merely a comparison step linked to the cyclic running of the sequence of the steps designated by 152, 154, 158. In particular, when it happens that the current index C, initially set at the value L, has reached the value 0, it has simply been verified (positive result from step 162) that the procedure has been completed, so that the system evolves towards a stop step designated by 164.

The solution that has just been described above may undergo a further improvement in terms of performance by exploiting the intrinsic parallelism of the basic algorithm.

The above can be done according to the procedure described in further detail in what follows.

In particular, a possible variant of implementation of the decompression process is based upon the consideration that the internal loop of the process presented previously (steps 152 and 160) can be considerably reduced in terms of iteration, by "exploding" the table $N_{13}$ table into a number of rows and by examining it carefully.

The table appearing below constitutes an example with L=4 and K=5. A further column has been added (the sixth) in addition to the ones necessary, in order to clarify further the mode of proceeding.

| L/K | 1 | 2 | 3 | 4 | 5 | 6 |
|---|---|---|---|---|---|---|
| 1 | 0 | 0 | 0 | 0 | 0 | 0 |
| 2 | 1 | 1 | 1 | 1 | 1 | 1 |
| 3 | 1 | 2 | 3 | 4 | 5 | 6 |
| 4 | 1 | 3 | 6 | 10 | 15 | 21 |

The first consideration that can be made stems from the fact that the first two rows (the first consisting entirely of 0's, the second entirely of 1's) are not necessary.

The above rows can be thus be removed, so simplifying the matrix, also considering that the last two components to be decoded can be obtained directly from the remainder of the input and its norm by subtraction.

Furthermore, the other L 2 rows can be modified, in such a way that they can contain directly the accumulations of the numbers, and, by being exploded according to the input norm, as indicated in the table below, where the cells marked by "BLANK" are empty and, in actual fact, not necessary.

Figure 14:
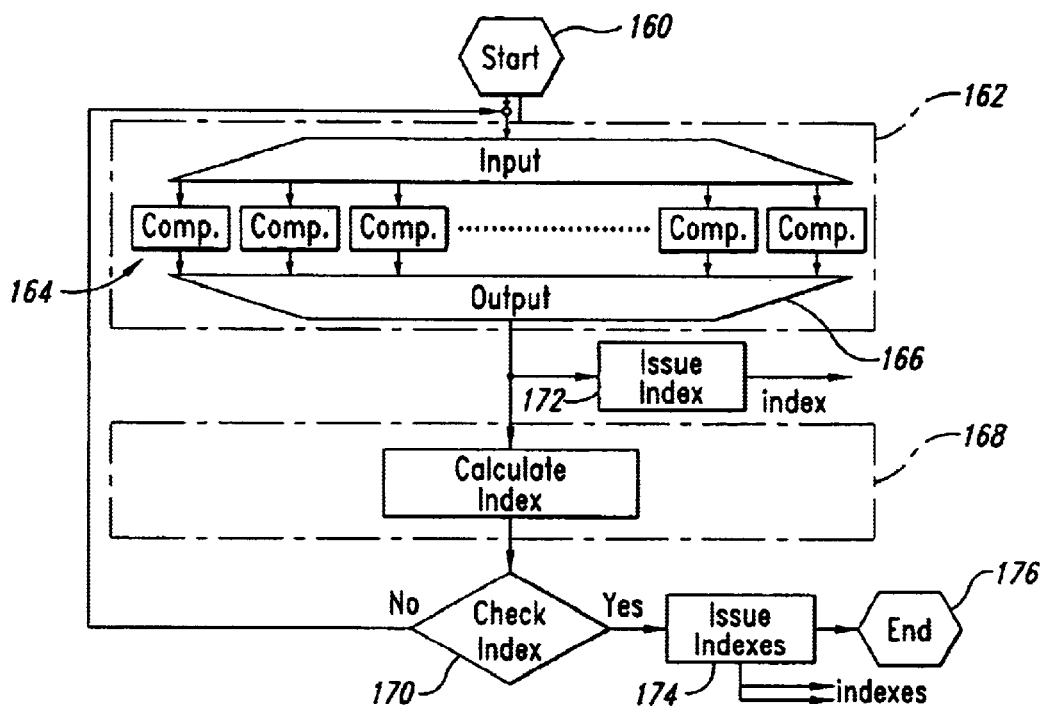
FIGS. 14 to 16 represent various possible implementations of the mechanism for decoding encoded words.

In this way, it is possible to simplify considerably the decoder, comparing the encoded word at input directly with the number contained in the row indicated by the input norm, as occurs in the flowchart represented in FIG. 14.

Basically, starting from an initial step 160, in a first stage, designated as a whole by 162, a certain number of comparison functions, designated as a whole by 164 and equal in number to the maximum value of the norm available (31, in the main example considered previously), carries out the comparison of the input value with the number in the table N_table. The above is achieved by selecting, in an output step 166, the first non-true row going from left to right.

In the second stage, designated as a whole by 168, the index is calculated on the basis of the winning position in the table, and it is possible to continue iteratively (according to the output of a control step, designated by 170, where the calculated index is checked against all the other indices).

The reference numbers 172 and 174 designate the steps of issuing the indices.

It will be appreciated that the situation is different for the last two indices. In these cases, the last one is equal to the difference between the remaining part of the norm and the input after all the subtractions have been carried out on them, and the other one is nothing other than the remaining input datum.

Instead of these last two indices being issued from step 172, they are issued from step 174, starting from which step the system evolves towards a final stop step designated by 176.

Figure 15:
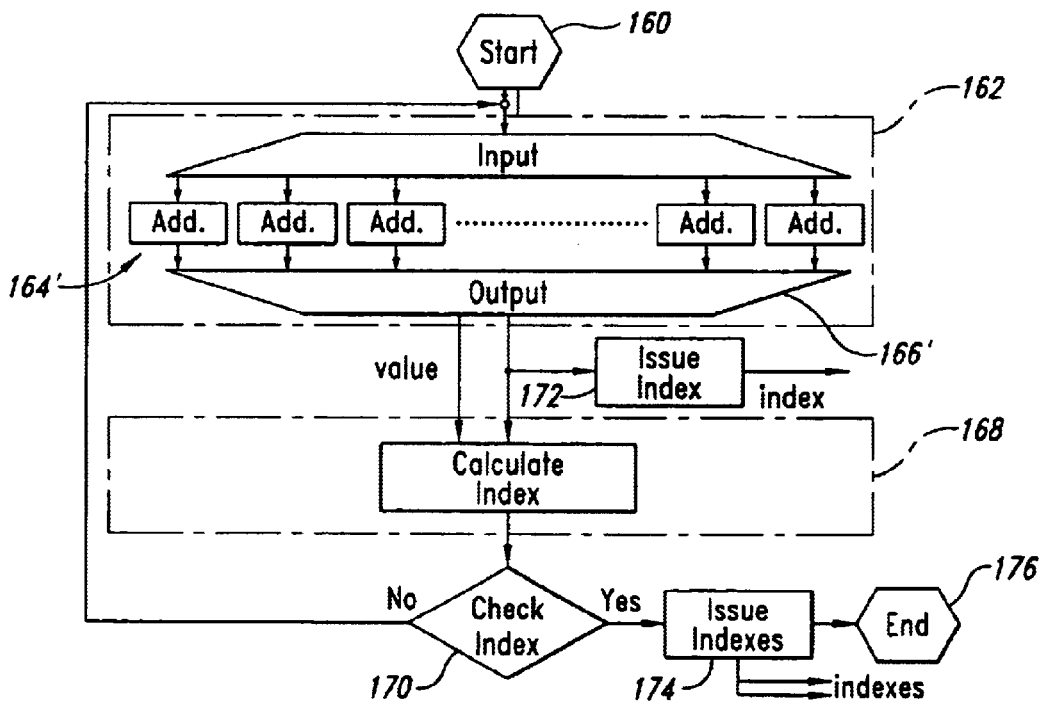

The variant embodiment represented in FIG. 15 is, from many points of view, very similar to the one represented in FIG. 14. For this reason, steps that are identical or equivalent to the ones already described previously with reference to FIG. 14 are designated, in FIG. 15, by the same reference numbers.

The main difference between the solution illustrated in FIG. 15 and the solution illustrated in FIG. 14 lies in the fact that, in step 166' of FIG. 15, the system chooses the first non-negative row, working from left to right so as to generate, in addition to the indication of position exploited in step 172 for generating the output indices (except for the last two), also the corresponding value, which is exploited in step 168.

To do this, the bank or battery of comparators 164 illustrated in the flowchart of FIG. 14 is replaced, in the flowchart of FIG. 15, by a block or battery of adders 164'.

The above solution is preferable, on account of the latency of the adders and the comparators and of the dimensions thereof.

Figure 16:
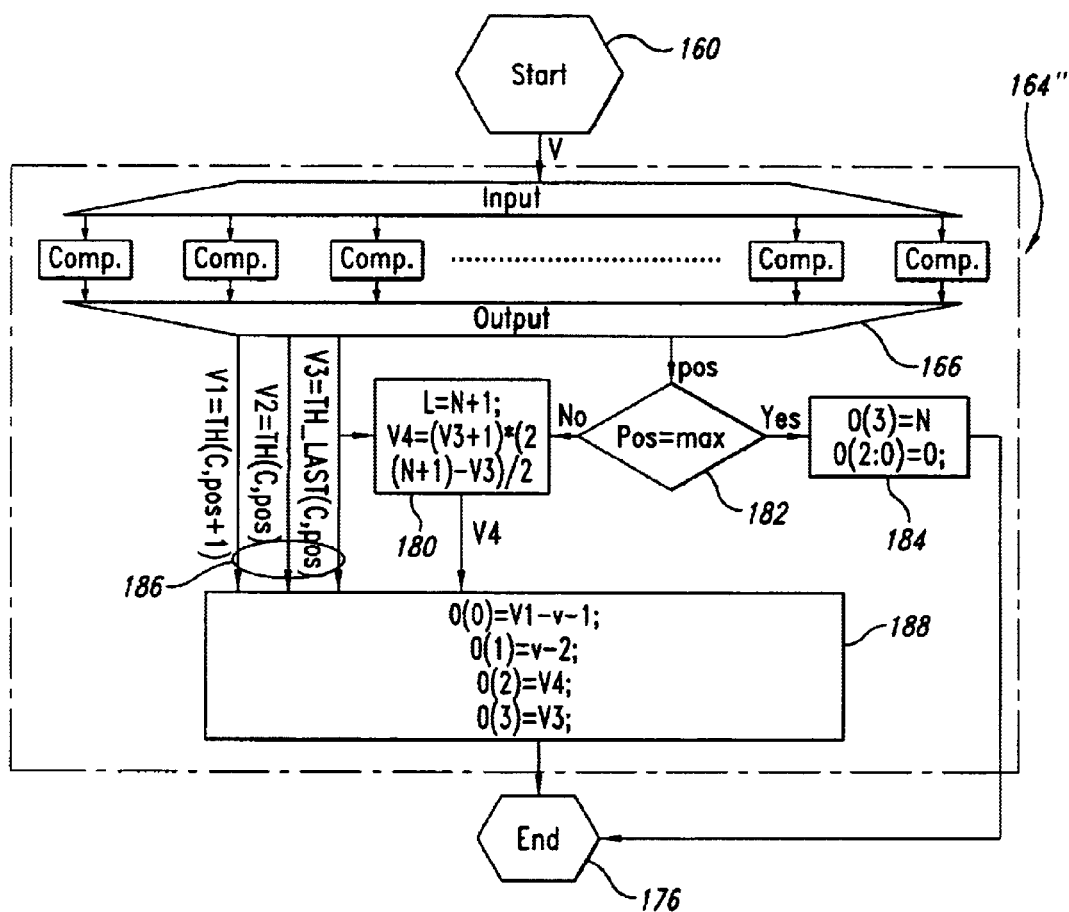

The solution represented in FIG. 16 corresponds to yet a further variant, in which all the possible comparisons are

|    | 1 | 2 | 3 | 4 | 5 | 6 |
|---|---|---|---|---|---|---|
| 1  | 1           | BLANK        | BLANK        | BLANK        | BLANK        | BLANK |
| 2  | 2 + 1 = 3   | 2            | BLANK        | BLANK        | BLANK        | BLANK |
| 3  | 5 + 1 = 6   | 3 + 2 = 5    | 3            | BLANK        | BLANK        | BLANK |
| 4  | 9 + 1 = 10  | 7 + 2 = 9    | 4 + 3 = 7    | 4            | BLANK        | BLANK |
| 5  | 14 + 1 = 15 | 12 + 2 = 14  | 9 + 3 = 12   | 5 + 4 = 9    | 5            | BLANK |
| 6  | 20 + 1 = 21 | 18 + 2 = 20  | 15 + 3 = 18  | 11 + 4 = 15  | 6 + 5 = 11   | 6 |
| 1' | 1           | BLANK        | BLANK        | BLANK        | BLANK        | BLANK |
| 2' | 3 + 1 = 4   | 3            | BLANK        | BLANK        | BLANK        | BLANK |
| 3' | 9 + 1 = 10  | 6 + 3 = 9    | 6            | BLANK        | BLANK        | BLANK |
| 4' | 19 + 1 = 20 | 16 + 3 = 19  | 10 + 6 = 16  | 10           | BLANK        | BLANK |
| 5' | 34 + 1 = 35 | 31 + 3 = 34  | 25 + 6 = 31  | 15 + 10 = 25 | 15           | BLANK |
| 6' | 55 + 1 = 56 | 52 + 3 = 55  | 46 + 6 = 52  | 36 + 10 = 46 | 21 + 15 = 36 | 21 | made in parallel in a single go, just using the information coming from an exploration of the table of the norm.

In this case, the articulation over two stages 162, 168, is no longer necessary.

As regards the exploration of the table of the norm, it is possible to considered the example of a first table TH containing 16*136 numbers (with a maximum norm of 15), of which the largest number is equal to 815 (10 bits) with approximately one half of the table filled by zeros. A table of this kind may be obtained by assuming display of all the possible words encoded for each possible norm in ascending order. In this way, also the four original words that form the encoded word are seen to be ordered.

In particular, it is possible to identify a group for each change of the number of components 2 (starting from 0). In the table TH appearing above, which is basically a threshold table, each value of encoded word representing the start of the groups is written.

At this point, however, the second table, which represents the true value of the word 3 and has the same dimensions as the table described previously, is necessary.

At this point, with reference to FIG. 16, it is possible to determine, starting from a certain encoded word, the original value of said word for words of the type O(0:3). This can be done in the way described in what follows.

If we designate by C the difference between the maximum norm available and the real norm N of the encoded word, and by "pos" the index in the first table of the group where the input encoded word is located, it is possible to define the following quantities.

O(0) 0TH(C, pos+1) input 1;
O(1)=input TH(C, pos);
(2)=(TH_LAST(C,pos)+1)*(2*(N+a)*TH_LAST(C, pos))/2;
O(3)=TH_LAST(C, pos).

It is also possible to avoid loading the second table called TH_LAST, by calculating the values directly.

In particular, it is possible to identify a group number equal to the norm represented (8, in the example shown), where each group is formed by the component with the same last value (in the example, the group 1 ranges from the encoded word 0 to the encoded word 44, the second ranges from the encoded word 45 to the encoded word 80, and so forth).

It may also be noted that, within each group, there is the number of subvectors (where each subvector is identified by the number in the table TH). In particular, the first group is made up of 9 subvectors (equal to the norm plus 1), the second of 8 subvectors (equal to the norm), and so forth up to the last group.

The groups from the first to the K-th can be counted by applying the following equation $$\sum_{K+1} subblocks = \sum_{grp=0}^{K-1} ((N+1) - grp) =$$

$$\{N+1 = L, K-1 = k\} = (k+1) \cdot \frac{2L-k}{2} = S.$$

By the number S, it is also possible to identify both the groups and the subvector, and hence obtain the two encoded values.

In particular, it is possible to determine to which group the current encoded word belongs and to count how many non-negative differences there are between the detected position designated by pos (which identifies the current subvector) and the number of encoded words belonging to each group preceding it. This may be done using the formula for calculating S.

The group number identifies the last non-compressed word. In order to obtain the word number two, the following formula must be applied $$O(2) = grp \cdot \frac{2 \cdot L - grp + 1}{2}.$$

In the flowchart of FIG. 16, the reference numbers 164 designate respective comparators which perform the comparison on the value of TH so as to select, in step 166, the first row, proceeding from left to right.

The reference numbers from 180 to 188 identify the steps in which the relations cited previously are implemented.

Figure 17:
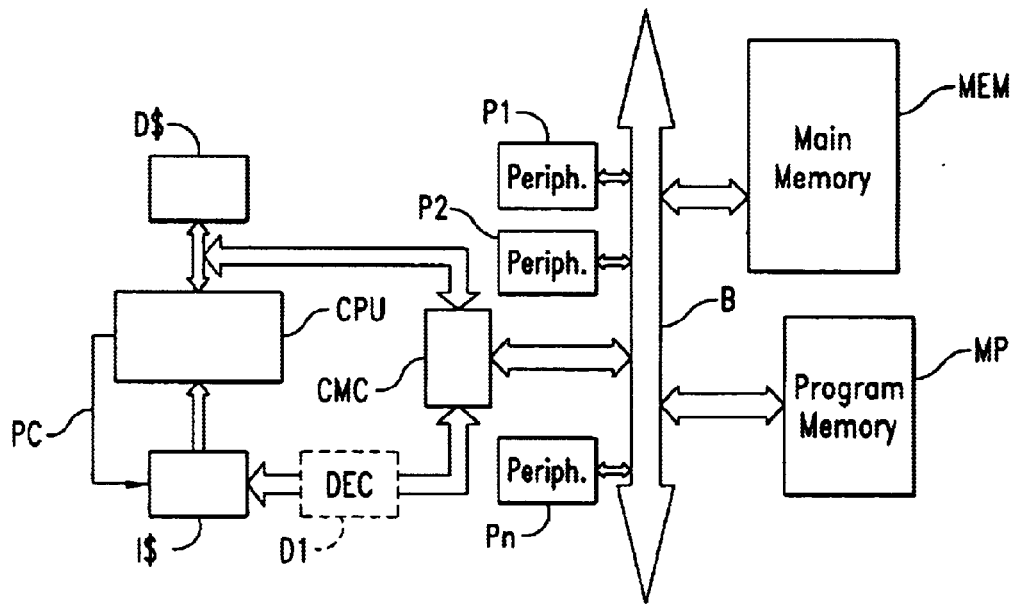
FIGS. 17 and 18 represent, in the form of block diagrams, two processing architectures which are able to use a solution according to the invention.
Figure 18:
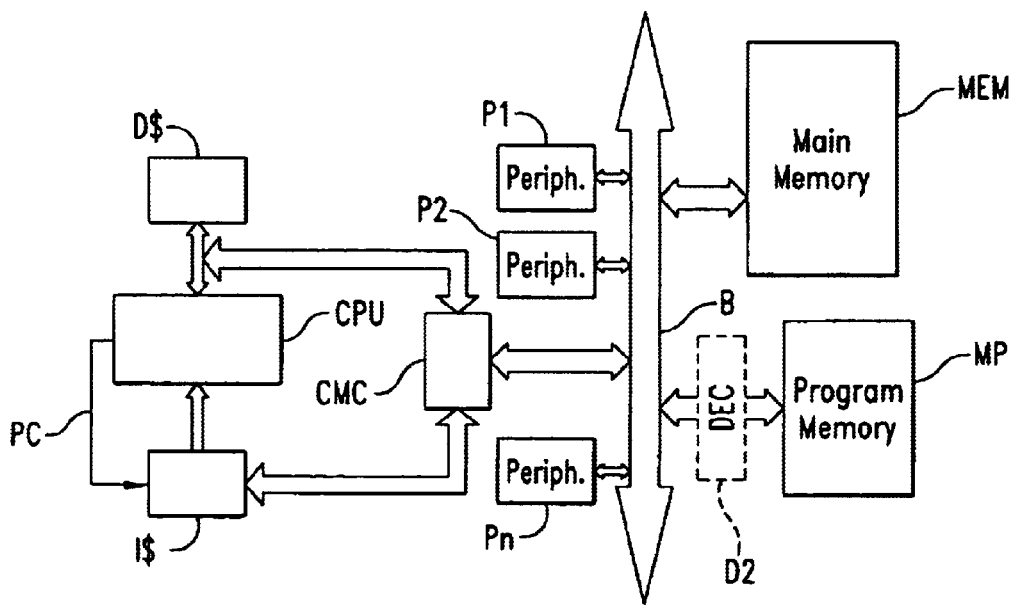

Finally, FIGS. 17 and 18 illustrate two possible architectures of the processing system that can apply the solutions according to the invention.

In both figures a processor is represented, designated as CPU, with associated thereto data caches D$ and instruction caches I$. The line on which the processor supplies the program counter PC to the instruction cache I$ is designated by PC.

It is then assumed that the processor CPU interfaces via a normal CMC interface with a bus B, which enables it to communicate with a main memory MEM, with one or more peripherals P1, P2, . . . Pn, and with a program memory PC.

In the architecture represented in FIG. 17, a decoder according to one embodiment of the invention, designated by D1, typically configured as a small ASIC, can be located between the system bus B and the instruction cache I$. This may be done by locating it in the so-called memory control unit or, if a cache hierarchy with at least two levels of cache is present, by locating it between the first level and the second level, so as to mask its latency directly.

Alternatively, as is represented in FIG. 18, a decoder according to the invention, designated by D2 is located directly at the output terminal of the external memory MP.

It will be appreciated that, in any case, the solution according to the another embodiment of invention enables the most important limitations currently existing, in relation to systems of an embedded type to be overcome, namely, costs, power absorption/dissipation, and encumbrance.

The solutions described above enable a reduction in occupation of such a system, by reducing its requirements in terms of memory. The solutions likewise achieve a reduction in power absorption/dissipation both by reducing the dimensions and hence the encumbrance of the program memory and by reducing the switching activity (SA) on the memory bus.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

Of course, without prejudice to the principle of the invention, the details of implementation and the embodiments may be amply varied with respect to what is described and illustrated herein, without thereby departing from the scope of the present invention, as defined in the annexed claims.

What is claimed is:

1. A process for converting binary words from a non-encoded format to a compressed encoded format, in which, in said compressed encoded format, binary words are, at least in part, represented by encoded bit sequences that are shorter than the respective binary word in the non-encoded format, said encoded bit sequences being selected according to a statistical recurrence of the respective words in the non-encoded format, and in which associated with binary words with higher recurrence are encoded bit sequences including numbers of bits that are accordingly smaller, a correspondence between binary words in non-encoded format and the encoded bit sequences associated therewith being established by indices of at least one encoding vocabulary, the process comprising:

arranging said indices in an orderly sequence;

organizing said sequence of indices in groups of vectors;

splitting each group of vectors into a given number of vectors; as well as at least one of the following operations:

encoding said vectors independently of one another; and calculating and storing in a data structure, for each group of vectors, a starting address of a compressed block, or else differences, expressed in bytes, with respect to a last complete address appearing in said data structure.

2. The process according to claim 1, applied to binary words making up instructions of a processor which has a row cache of given size, wherein the organizing step includes forming said groups of vectors with size equal to the row cache of the processor, so that each vector contains a number of indices equal to the ratio between the size of said cache row and the number of vectors contained in each group.

3. The process according to claim 2, wherein both the number of vectors comprised in each group and the number of indices composed in each vector are powers of two.

4. The process according to claim 1, further comprising splitting said binary words in said non-encoded format into a given number of subwords, said binary subwords being convened into said encoded format by resorting to respective encoding vocabularies.

5. The process according to claim 4, wherein splitting said binary words includes splitting said binary words into two binary subwords, one of which corresponds to a high part and the other to a low part of the binary word in the non-encoded format.

6. The process according to claim 1, further comprising constituting said at least one encoding vocabulary, reserving to binary words of low recurrence respective encoded bit sequences which comprise a number of bits that may be not less than the number of bits comprised in the corresponding binary word in non-encoded format.

7. The process according to claim 1, further comprising storing said groups of vectors, and storing, for each of said groups of vectors, a respective starting address.

8. The process according to claim 7, wherein storing a respective starting address includes providing an address-translation table for saving the starting addresses of said groups of vectors.

9. The process according to claim 1, further comprising determining, for each of said vectors, a corresponding norm resulting from the addition of the indices contained in the vector itself.

10. The process according to claim 9, further comprising subjecting said norm to variable-length coding.

11. The process according to claim 10, wherein said norm is encoded with a bit string comprising a tag field and a field of bits representing a real value of the norm, the norm values with higher recurrence being represented by tag fields and by fields representing the real value, which are shorter than the tag fields and the fields representing the real value reserved to the norm values with lower statistical recurrence.

12. The process according to claim 9, wherein, in order to convert said binary words from said non-encoded format into said encoded format, the least significant bits of each non-encoded binary word are attributed to the corresponding encoded bit sequence, proceeding with a series of operations of division by two corresponding to shift operations of bits comprised in the binary word in non-encoded format, said shift operations being performed until the corresponding norm reaches a predetermined value.

13. The process according to claim 12, wherein said encoded bit sequence is organized as a set of fields comprising:

a field identifying the number of shifts made;

identification of the bits subjected to shifting;

the resulting norm value; and a shortest encoded bit sequence.

14. The process according to claim 13, wherein organizing the encoded bit sequence as a set of fields includes locating said field identifying the bits subjected to shifting immediately after the corresponding shortest encoded bit sequence.

15. The process according to claim 13 wherein, in order to convert a given binary word from said encoded format into said non-encoded format, the process comprises the operations of:

identifying the corresponding group of vectors in the encoded format;

reading, starting from said group of vectors, said field identifying how many shifts have been made;

reading the identification of the bits subjected to shifting;

reading the resulting norm value;

reading said shortest encoded bit sequence; and constructing said binary word in said non-encoded format starting from the information read.

16. The process according to claim 9, further comprising:

defining a number of successive indices that can be encoded together as a single encoded word;

building a look-up table, of size LxK, where L is said number of successive indices that can be encoded together and K represents a maximum norm possible for the encoded words, then obtaining the encoded word starting from L successive indices according to the relation $$encoded = \sum_{i=1}^{L} \sum_{j=1}^{K} Ntable[i, j]$$

where "encoded" represents the encoded word, the summations extend for i ranging from 1 to L and for j ranging from 1 to $x_i$, respectively, and Ntable[i, j] represents a set of integer-coordinate points that identify a pyramid of i-dimensions with norm j, said norm expressing a sum of the absolute values of the co-ordinates of the points that make up the pyramid.

17. The process according to claim 16, wherein, in order to convert a given binary word from said encoded format into said non-encoded format, the process comprises the operations of:

reading said given binary word and a corresponding norm value; locating a matrix value in a last row of said table in a column identified by the norm value;

comparing the matrix value with the given binary word in said encoded format;

if the given binary word is smaller than the matrix value read, subtracting the given binary word from the matrix value read and reducing the norm value by one until the comparison is satisfied; and if the given binary word is greater than the matrix value read, a difference between the starting norm and the effective norm is the last of the encoded indices, and the process is restarted.

18. The process according to claim 17, wherein the comparing step includes:

comparing the given binary word directly with a number contained in a row indicated by the corresponding norm value; and calculating a resulting index to be used for decoding, on the basis of the winning position within the table thus identified.

19. The process according to claim 18, wherein, to obtain the indices to be used, coding proceeds by obtaining a last index as equal to the difference between the remaining part of the norm value and the value of the norm value after all the subtractions have been made on them, obtaining instead the penultimate index as residual input value.

20. The process according to claim 16, further comprising:

forming a table which gathers all the encoded words possible for said norm value in ascending order, so that also the original words that form the encoded word are ordered with respect to one another;

determining, starting from a certain encoded word, the corresponding binary word in non-encoded format on the basis of the difference between the maximum norm available and the real norm of the encoded word, defining an index in the first table of the group where the input word is located; and determining to which group the current encoded word belongs, by counting how many non-negative differences exist for the position identified by said index, which identifies the current subvector, and the number of encoded words that belong to each preceding group.

21. The process according to claim 1 wherein said encoded bit sequences map, within them, an address identifying the corresponding binary word in non-encoded format, so that each of said encoded bit sequences can be converted into the corresponding binary word in non-encoded format independently of other encoded bit sequences.

22. A processor system comprising:

plural cache memories;

a memory;

a peripheral unit;

a bus connected to the memory and peripheral unit;

a bus interface;

a processing unit configured to interact via the bus interface and the bus with the memory and peripheral unit; and a converter modulelocated in at least one intermediate position between:

one of said cache memories and said bus; and said bus and at least one of said memories, the converter module including means for converting binary words from a non-encoded format to a compressed encoded format, in which, in said compressed encoded format, binary words are, at least in part, represented by encoded bit sequences that are shorter than the respective binary word in the non-encoded format, said encoded bit sequences being selected according to a statistical recurrence of the respective words in the non-encoded format, and in which associated with binary words with higher recurrence are encoded bit sequences including numbers of bits that are accordingly smaller, a correspondence between binary words in non-encoded format and the encoded bit sequences associated therewith being established by indices of an encoding vocabulary, the means including:

means for arranging said indices in an orderly sequence;

means for organizing said sequence of indices in groups of vectors;

means for splitting each group of vectors into a given number of vectors; and means for performing at least one of the following operations:

encoding said vectors independently of one another; and calculating and storing in a data structure, for each group of vectors, a starting address of a compressed block, or else differences, expressed in bytes, with respect to a last complete address appearing in said data structure.

23. The system according to claim 22, wherein said plurality of caches includes an instruction cache and said converter module is set between the instruction cache and said bus interface.

24. The system according to claim 22 wherein said converter module is set between said bus and a program memory associated with said processing unit.

25. The system according to claim 22, wherein the plurality of cache memories includes a cache organized on two levels and said converter module is set between said two cache levels.

26. A computer program product directly loadable in a memory of a digital processor and comprising software code portions for performing a process for converting binary words from a non-encoded format to a compressed encoded format when said product is run on the processor, in which, in said compressed encoded format, binary words are, at least in part, represented by encoded bit sequences that are shorter than the respective binary word in the non-encoded format, said encoded bit sequences being selected according to a statistical recurrence of the respective words in the non-encoded format, and in which associated with binary words with higher recurrence are encoded bit sequences including numbers of bits that are accordingly smaller, a correspondence between binary words in non-encoded format and the encoded bit sequences associated therewith being established by indices of at least one encoding vocabulary, the process comprising:

arranging said indices in an orderly sequence;

organizing said sequence of indices in groups of vectors;

splitting each group of vectors into a given number of vectors; as well as at least one of the following operations:

encoding said vectors independently of one another; and calculating and storing in a data structure, for each group of vectors, a starting address of a compressed block, or else differences, expressed in bytes, with respect to a last complete address appearing in said data structure.

* * * * *

UNITED STATES PATENT AND TRADEMARK OFFICE
CERTIFICATE OF CORRECTION

PATENT NO. : 6,774,827 B2
DATED : August 10, 2004
INVENTOR(S) : Danilo Pietro Pau et al.

It is certified that error appears in the above-identified patent and that said Letters Patent is hereby corrected as shown below:

Column 17,
Line 31, "composed in each vector" should read as -- comprised in each vector --.
Line 35, "convened into" should read as -- converted into --.
Line 63, "the norn values" should read as -- the norm values --.

Signed and Sealed this

Twenty-first Day of December, 2004

JON W. DUDAS
*Director of the United States Patent and Trademark Office*